(12) United States Patent
Tripoli et al.

(10) Patent No.: US 10,630,267 B2
(45) Date of Patent: Apr. 21, 2020

(54) OSCILLATOR CIRCUIT, AND RELATED INTEGRATED CIRCUIT

(71) Applicant: STMicroelectronics S.r.l., Agrate Brianza (IT)

(72) Inventors: Giovanni Carlo Tripoli, Rho (IT); Cecilia Teresa Rita Gatti, Barlassina (IT); Paul Georges Marie Rose, Lodi (IT); Roberto Faravelli, Pavia (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 16/243,455

(22) Filed: Jan. 9, 2019

(65) Prior Publication Data
US 2019/0222203 A1 Jul. 18, 2019

(30) Foreign Application Priority Data
Jan. 16, 2018 (IT) .................. 102018000001115

(51) Int. Cl.
| H03K 3/26 | (2006.01) |
| H03B 5/00 | (2006.01) |
| H03K 3/03 | (2006.01) |
| G05F 1/577 | (2006.01) |
| H03K 3/011 | (2006.01) |
| H03K 5/24 | (2006.01) |

(52) U.S. Cl.
CPC .......... H03K 3/0315 (2013.01); G05F 1/577 (2013.01); H03K 3/011 (2013.01); H03K 5/24 (2013.01)

(58) Field of Classification Search
CPC .......... H03K 3/0315; H03K 5/24; G05F 1/577
See application file for complete search history.

(56) References Cited

U.S. PATENT DOCUMENTS

| 4,893,095 A | * | 1/1990 | Thommen | ............ | H03K 3/0315 |
| | | | | | 331/108 B |
| 5,180,995 A | * | 1/1993 | Hayashi | .................. | H03B 5/04 |
| | | | | | 331/176 |

(Continued)

FOREIGN PATENT DOCUMENTS

| EP | 0 304 975 A1 | 3/1989 | | |
| EP | 2 482 453 A1 | 8/2012 | | |
| JP | 06-061801 | * | 3/1994 | ............. H03K 3/354 |

*Primary Examiner* — Kenneth B Wells
(74) *Attorney, Agent, or Firm* — Seed IP Law Group LLP

(57) ABSTRACT

An oscillator circuit including a ring oscillator and a reference current source is provided. The ring oscillator includes an odd number of inverter stages. Each inverter stage includes a first transistor having a first reference threshold that varies over temperature. The reference current source is configured to generate a plurality of currents, where a respective current is applied directly to the drain of a respective first transistor of a respective inverter stage. The reference current source includes a reference transistor that has a second reference threshold that varies over temperature; a resistor coupled between a gate and a source of the reference transistor; a second transistor having a source coupled to the gate of the reference transistor for generating a reference current that flows through the resistor to regulate a voltage of the resistor to the second threshold voltage; and a current mirror configured to generate the plurality of currents.

19 Claims, 5 Drawing Sheets

(56) References Cited

U.S. PATENT DOCUMENTS

| | | | |
|---|---|---|---|
| 5,774,404 A * | 6/1998 | Eto | G11C 11/406 |
| | | | 365/222 |
| 6,326,855 B1 * | 12/2001 | Jelinek | H03L 1/00 |
| | | | 327/103 |
| 6,667,925 B2 * | 12/2003 | Kobayashi | G11C 7/04 |
| | | | 365/189.09 |
| 6,777,991 B2 * | 8/2004 | Murakami | H03L 7/0802 |
| | | | 327/156 |
| 7,388,447 B1 | 6/2008 | Potanin et al. | |
| 7,589,583 B2 * | 9/2009 | Yoshikawa | G11O 5/145 |
| | | | 327/536 |
| 8,040,195 B2 * | 10/2011 | Murata | H03K 3/0315 |
| | | | 327/108 |
| 8,248,171 B1 * | 8/2012 | Bugbee | H03K 3/0315 |
| | | | 331/176 |
| 9,112,514 B2 * | 8/2015 | Sun | H03K 3/0322 |
| 2003/0198114 A1 | 10/2003 | Fiscus | |
| 2005/0052923 A1 * | 3/2005 | Uchikoba | G11C 11/406 |
| | | | 365/222 |
| 2005/0258911 A1 | 11/2005 | Higuchi et al. | |
| 2006/0082419 A1 * | 4/2006 | Sakaguchi | H03K 3/011 |
| | | | 331/57 |
| 2006/0226921 A1 | 10/2006 | Hsu | |
| 2007/0146072 A1 * | 6/2007 | Ohta | H03K 3/0315 |
| | | | 330/253 |
| 2009/0302954 A1 | 12/2009 | Chen et al. | |

* cited by examiner

OSCILLATOR CIRCUIT, AND RELATED INTEGRATED CIRCUIT

BACKGROUND

Technical Field

Embodiments of the present disclosure relate to oscillator circuits. Specifically, various embodiments of the present disclosure relate to temperature corrected/compensated current-controlled ring oscillators.

Description of the Related Art

Many integrated circuits use a stable oscillator, which provides an oscillating electronic signal. For example, digital sequential circuits, such as micro-processors, may use a clock signal. However, also analog circuits may use an oscillating signal, e.g., a reference oscillating signal used to generate and/or elaborate signals. For example, in MEMS sensors systems an oscillating signal may be used as a precise time reference for an electrical acquisition chain. For example, the timing reference signal may feed a phase generator.

In case of analog circuits, the precision of the oscillating signal may thus directly impact the performances of the circuit. However, also in case of digital circuits the precision of the clock signal may influence the behavior of the circuit, e.g., in case of real time clocks or data transmission systems.

Often such oscillators are implemented with a ring-oscillator. For example, ring oscillators permit a high rejection to power supply variations and a low spread over technology processes tolerances and low drift over temperature.

For example, FIG. 1 shows an example of an oscillator comprising a ring oscillator 2 generating an oscillating signal OSC and a reference current source 1 generating at least one reference current $i_{osc}$ for the ring oscillator 2.

BRIEF SUMMARY

In view of the above, it is an objective of the various embodiments of the present disclosure to provide solutions for generating a temperature compensated oscillating signal.

According to one or more embodiments, one or more of the above objectives is achieved by an oscillator circuit having the features specifically set forth herein. Embodiments moreover concern a related integrated circuit.

As mentioned before, various embodiments of the present disclosure relate to an oscillator circuit. Specifically, the oscillator circuit comprises a ring oscillator and reference current source.

In various embodiments, the ring oscillator comprises an odd number of inverter stages including a first inverter stage, a last inverter stage, and one or more intermediate inverter stages, wherein the input terminal of each intermediate inverter stage is connected to the output terminal of an upstream inverter stage and the output terminal of each intermediate inverter stage is connected to the input terminal of a downstream inverter stage, wherein the input terminal of the first inverter stage is connected to the output terminal of the last inverter stage.

In various embodiments, each inverter stage comprises an n-channel FET having a first reference threshold varying over temperature. Specifically, the gate terminal of the n-channel FET is connected to the input terminal of the respective inverter stage, the drain terminal of the n-channel FET is connected to the output terminal of the respective inverter stage and the source terminal of the n-channel FET is connected to a reference voltage, such as ground. Moreover, a capacitance is connected between the drain and source terminals of the n-channel FET.

In various embodiments, the reference current source is configured to generate a plurality of currents, wherein each of the plurality of currents is applied directly to the drain terminal of a respective n-channel FET of a respective inverter stage. Accordingly, in various embodiments, the drain terminal of the n-channel FET of the last inverter stage provides an oscillating signal having a frequency depending on the delay introduced by each inverter stage of the ring oscillator, which in turn depends on the value of the capacitance, the current used to selectively charge the capacitance and the first reference threshold.

Specifically, in various embodiments, the reference current source comprises an n-channel reference FET having a second reference threshold varying over temperature, wherein the source terminal of the reference transistor is connected to the reference voltage, such as ground, and bias device configured to generate a bias current for the n-channel reference FET, wherein the bias current is applied to the drain terminal of the n-channel reference FET.

In various embodiments, the reference current source comprises further a resistor connected between the gate and source terminals of the n-channel reference FET, and a further n-channel FET, wherein the gate terminal of the further n-channel FET is connected to the drain terminal of the n-channel reference FET and the source terminal of the further n-channel FET is connected to the gate terminal of the n-channel reference FET. Accordingly, the further n-channel FET is configured to generate a reference current flowing through the resistor, thereby regulating the voltage at the resistor to the second threshold voltage.

In various embodiments, the reference current source comprises also a current mirror connected to the drain terminal of the further n-channel FET and configured to generate the plurality of currents by mirroring the reference current.

For example, the current mirror may comprise an input p-channel FET, wherein the source terminal of the input p-channel FET is connected to a supply voltage, the drain terminal of the input p-channel FET is connected to the drain terminal of the further n-channel FET and the gate terminal of the input p-channel FET is connected to the drain terminal of the input p-channel FET. In this case, the current mirror may further comprise a respective output p-channel FET for each of the plurality of currents, wherein the source terminal of each of the output p-channel FET is connected to the supply voltage, the gate terminal of each of the output p-channel FET is connected to the gate terminal of the input p-channel FET and the drain terminal of each of the output p-channel FET is connected to the drain terminal of a respective n-channel FET of a respective inverter stage.

The bias current may thus be generated by mirroring the reference current. For example, in this case, the circuit may comprise a further output p-channel FET for the current mirror, wherein the source terminal of the further output p-channel FET is connected to the supply voltage, the gate terminal of the further output p-channel FET is connected to the gate terminal of the input p-channel FET and the drain terminal of the further output p-channel FET is connected to the drain terminal of the n-channel reference FET. However, the bias current may also be generated in other ways, e.g., by means of a further current mirror configured to generate the bias current by mirroring a further current. For example, such a further current may be generated by a further FET and a further resistor.

Accordingly, in the embodiment considered, the reference current depends on the resistance of the resistor and the second reference threshold. Accordingly, by using a first reference threshold and a second reference threshold having the same temperature behavior, the temperature behavior of reference current source may compensate the temperature behavior of the ring oscillator. For example, for this purpose, the n-channel FET of the inverter stages and the n-channel reference FET may be implemented with the same technology and the same dimension, whereby the second reference threshold varies over temperature as the first reference threshold.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not confine the scope or meaning of the embodiments.

Figure 1:
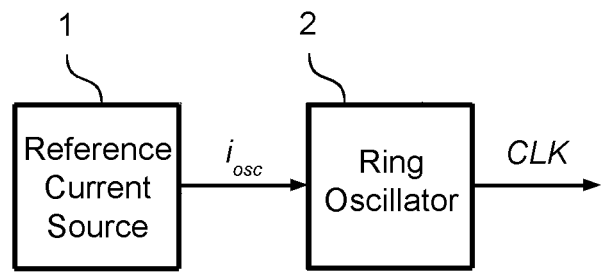
FIG. 1 shows an example of an oscillator.

In the following FIGS. 2-9 parts, elements or components which have already been described with reference to FIG. 1 are denoted by the same references previously used in such Figures; the description of such previously described elements will not be repeated in the following in order not to overburden the present detailed description.

As mentioned before, various embodiments of the present application relate to an oscillator circuit generating an oscillating/clock signal. In various embodiments, the oscillator circuit is configured in order to maintain the frequency of the oscillating signal substantially constant over temperature.

Figure 2:
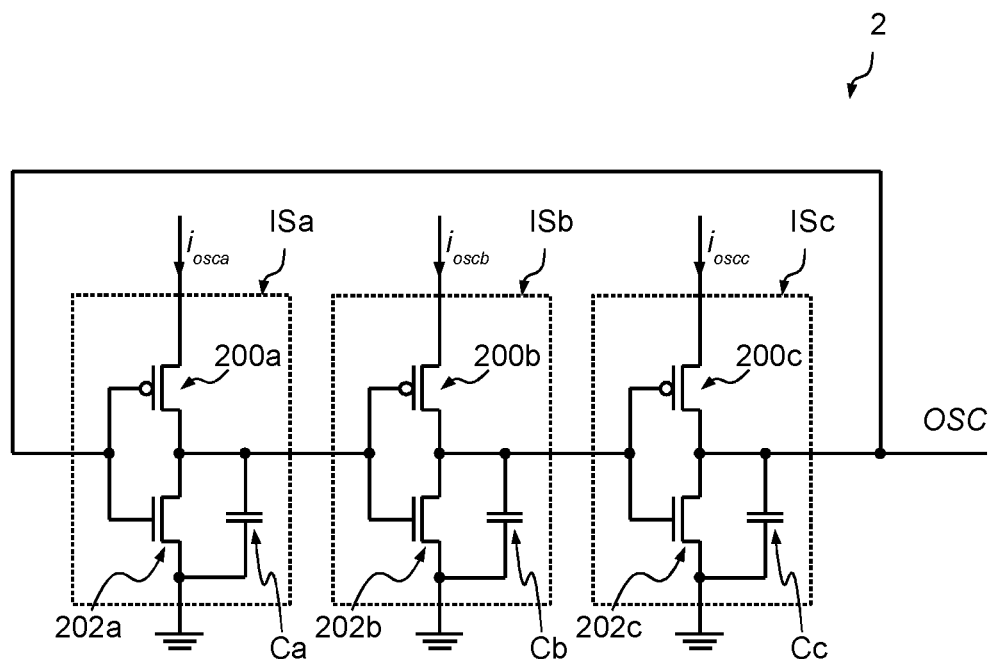
FIG. 2 shows an example of a ring oscillator.

FIG. 2 shows an example of a ring oscillator 2. Specifically, a ring oscillator 2 comprises a plurality of inverter stages IS. Specifically, the number of the inverter stages IS is odd and at least three, for example, 3, 5 or 7 inverter stages IS. Thus, generally, the ring oscillator 2 comprises a first inverter stage ISa, a last inverter stage ISc, and one or more intermediate inverter stages ISb. Each of the inverter stages IS comprises an input terminal and an output terminal. Moreover, the inverter stages IS are connected in cascade in order to form a loop, i.e.:

the input terminal of each intermediate inverter stage ISb is connected (e.g., directly) to the output terminal of a previous/upstream inverter stage IS and the output terminal of each intermediate inverter stage ISb is connected (e.g., directly) to the input terminal of a following/downstream inverter stage IS; and the input terminal of the first inverter stage ISa is connected (e.g., directly) to the output terminal of the last inverter stage ISc.

For example, in the example considered, each inverter stage IS comprises a p-channel Field Effect Transistor (FET) 200, such as a p-channel Metal-Oxide-Semiconductor Field Effect Transistor (MOSFET), i.e., a PMOS, and an n-channel FET 202, such as an n-channel MOSFET, i.e., an NMOS. Accordingly, in the example considered, the ring-oscillator comprises p-channel transistors 200a, 200b and 200c and n-channel transistors 202a, 202b and 202c for the inverter stages ISa, ISb and ISc, respectively.

Specifically, in the example considered, the gate terminal of the p-channel transistor 200 and the gate terminal of the n-channel transistor 202 of each inverter stage IS are connected to the input terminal of the respective inverter stage IS. The source terminal of the p-channel transistor 200 is configured to receive a respective reference current $i_{osc}$, and the source terminal of the n-channel transistor 202 is connected to a reference voltage, such as ground. The drain terminal of the p-channel transistor 200 and the drain terminal of the n-channel transistor 202 of each inverter stage IS are connected to the output terminal of the respective inverter stage IS. In the example considered, each of the inverter stages ISa, ISb and ISc is thus driven by a respective reference current $i_{osca}$, $i_{oscb}$ and $i_{oscc}$.

Generally, a capacitance C is associated with each output terminal, which is connected to the input terminal of a following inverter stage IS. Generally, the capacitance C may thus correspond to the parasitic drain-source capacitances of the transistors 200 and 202 of the inverter stage and the parasitic gate-source capacitances of the transistors 200 and 202 of the following inverter stage IS. However, also an additional capacitor may be used, e.g., a capacitor connected between the drain and source terminals of each transistor 202. Thus, by alternatively charging the capacitance C via the p-channel FET 200 and discharging the capacitance C via the n-channel FET 202, the various switching stages IS will sequentially switch, wherein the last inverter stage ISc drives again the switching of the first inverter stage ISa. The operation of such ring oscillators is well known in the art. For example, reference is made to documents EP 2 482 453 A1, US 2006/0226921 A1 and US 2009/0302954 A1, which are incorporated herein by reference.

Due to the fact that the switching frequency of the ring oscillator depends on the charge time of the capacitor C and thus the value of the reference current $i_{osc}$, the reference currents $i_{osc}$ for the ring-oscillator should be constant.

Figure 3:
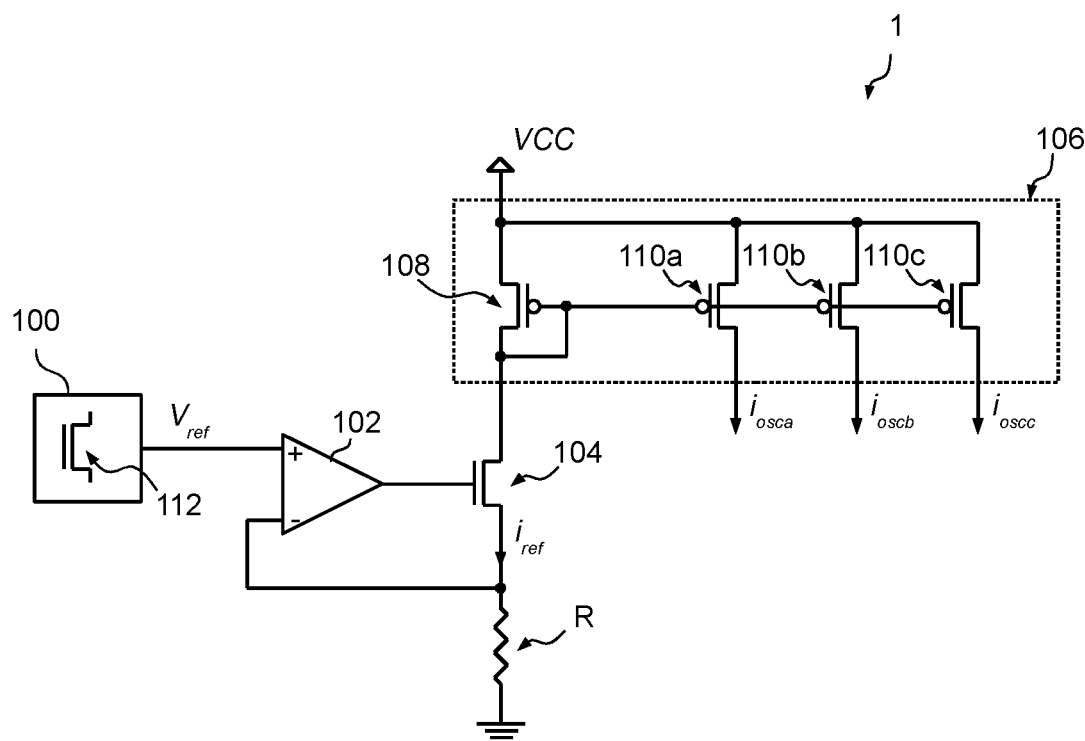
FIGS. 3 and 4 show embodiments of reference current sources for a ring oscillator.
Figure 4:
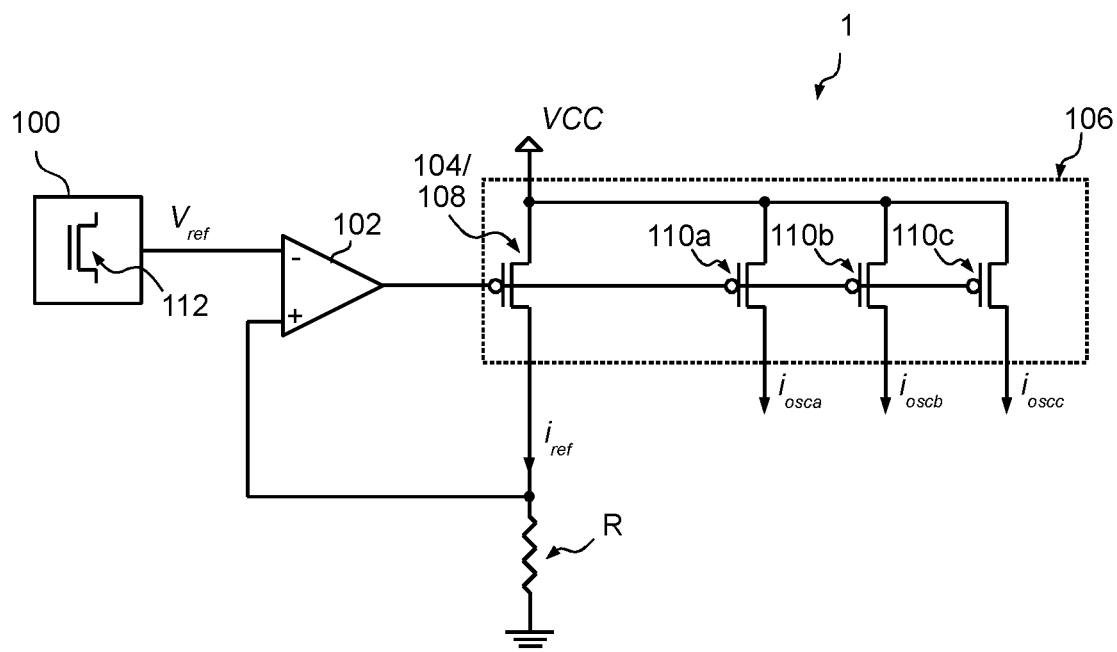

For example, FIGS. 3 and 4 show two possible embodiments of reference current sources 1.

Specifically, in the embodiments considered, the reference current source 1 comprises:
- a band-gap reference voltage source 100;
- an operational amplifier 102;
- a variable current generator 104; and
- a resistor R.

Specifically, the variable current generator 104 is configured to generate a current $i_{ref}$ as a function of the signal provided at the output of the operational amplifier 102.

For example, the variable current generator 104 is implemented with an n-channel FET, such as an NMOS, in FIG. 3 and the variable current generator 104 is implemented with a p-channel FET, such as a PMOS, in FIG. 4. The output of the variable current generator 104 is connected (e.g., directly) via the resistor R to a reference voltage, such as ground.

In the example considered, the reference voltage source 100 generates a reference voltage $V_{ref}$, which is applied (e.g., directly) to a first input terminal of the operational amplifier 102. Conversely, the second input terminal of the operational amplifier 102 is connected (e.g., directly) to the output terminal of the current generator 104 and receives thus the voltage at the resistor R.

For example, as shown in FIG. 3, when using an n-channel FET 104, the reference voltage $V_{ref}$ may be applied to the non-inverting/positive input terminal of the operational amplifier 102 and the output terminal of the current generator 104 may be connected to the inverting/negative input terminal of the operational amplifier 102.

Conversely, as shown in FIG. 4, when using a p-channel FET 104, the reference voltage $V_{ref}$ may be applied to the inverting/negative input terminal of the operational amplifier 102 and the output terminal of the current generator 104 may be connected to the non-inverting/positive input terminal of the operational amplifier 102.

Accordingly, the operational amplifier 102 applies (via the feedback loop comprising the variable current generator 104 and the resistor R) the reference voltage $V_{ref}$ to the resistor R. Accordingly, in the stationary condition the current $i_{ref}$ generated by the current generator 104 will be:

$$i_{ref} = V_{ref}/R \quad (1)$$

In the examples considered, the reference current source 1 may thus also comprise a current mirror 106 in order to generate a plurality of reference currents $i_{osc}$ for the inverter stages IS, i.e., the reference currents $i_{osca}$, $i_{oscb}$ and $i_{oscc}$.

In the embodiments considered, the current mirror 106 is implemented with p-channel FETs, such as PMOS. Specifically, the current mirror 106 comprises an input p-channel FET 108, and a plurality of output p-channel FET 110, e.g., transistors 110a, 110b and 110c, wherein the gate terminals of the output transistors 110 are driven with the same gate-source voltage as the input transistor 108, i.e., the gate terminals of the output transistors 110 are connected (e.g., directly) to the gate terminal of the input transistor 108. The source terminals of the input and output p-channel FET 108 and 110 are connected to a power supply voltage VCC. The drain terminal of each of the output p-channel FETs 110 provides a respective reference current $i_{osc}$, e.g., the transistors 110a, 110b and 110c provide the reference currents $T_{osca}$, $i_{oscb}$ and $i_{oscc}$. The drain terminals of the FETs 110a, 110b and 110c may thus be connected (e.g., directly) to the source terminals of the transistors 200a, 200b and 200c of the ring-oscillator 2, respectively.

As shown in FIG. 3, when using an n-channel FET 104, the drain terminal and the gate terminal of the input p-channel FET 108 may be connected (e.g., directly) to the drain terminal of the n-channel FET 104, whereby the current $i_{ref}$ flows also through the input transistor FET 108.

Conversely, as shown in FIG. 4, when using a p-channel FET 104, the input p-channel FET 108 may directly correspond to the variable current source 104, i.e., the drain terminal of the input p-channel FET 108 represents the output terminal of the variable current generator 104 (connected to the resistor R) and the gate terminal of the input p-channel FET 108 is connected to the output of the operational amplifier 102. Also in this case, the current $i_{ref}$ flowing through the resistor R flows also through the input transistor FET 108. Generally, also in this case, the input p-channel FET 108 of the current mirror 106 may also be in addition to the p-channel FET 104 (similar to what has been shown in in FIG. 3).

Such oscillators comprising cascaded inverting stages IS have the advantage that the frequency of the clock signal is rather independent from variations of the supply voltage VCC, thereby increasing the power supply rejection ratio (PSRR) of the output frequency of the oscillator.

However, as described also in the above cited documents, a band-gap reference voltage source 100 will intrinsically exhibit a variation of the reference voltage $V_{ref}$ as a function of the temperature of the reference voltage source 100, thereby varying the reference current $i_{ref}$. The cited documents provide thus solutions for compensating these variations. For example, document US 2009/0302954 A1 proposes using variable resistors R, which compensate the variation of the reference voltage $V_{ref}$, thereby maintaining the current $i_{ref}$ and similarly the currents $i_{osc}$ constant.

In various embodiments, a different approach is used for reducing/compensating the variation of the frequency of the oscillating signal OSC over temperature.

Specifically, again the oscillator circuit has the structure as shown in FIG. 1, i.e., the oscillator circuit of the present disclosure comprises:
- a ring oscillator 2' configured to generate an oscillating signal OSC, wherein the ring oscillator 2' comprises a plurality of inverter stages IS', wherein each inverter stage IS' is driven via a respective reference current $i_{osc}$, and
- a reference current source 1 configured to generate the reference currents $i_{osc}$ for the inverter stages IS of the ring oscillator 2'.

As mentioned before, in the prior-art solution the temperature compensation is achieved by maintaining the reference current(s) $i_{osc}$ substantially constant over a given temperature range, typically the possible range of operating temperatures of the oscillator circuit, e.g., between 0 and 40° C., possibly also between −20 and 80° C.

Conversely, in various embodiments of the present description, instead of maintaining the reference currents $i_{osc}$ constant over temperature, the reference current source 1 and the ring oscillator 2' are configured to compensate each other.

Specifically, in various embodiments, the reference current source 1 has the architecture as described with respect to FIG. 3 or 4, and the respective description fully applies. Specifically, in various embodiments, the reference current source 1 comprises:
- a band-gap reference voltage source 100 configured to generate a reference voltage $V_{ref}$;
- an operational amplifier 102;
- a variable current generator 104; and
- a resistor R.

Specifically, in line with the description of FIGS. 3 and 4, the reference voltage source 100, the operational amplifier 102, the variable current generator 104 and the resistor are configured to apply the reference voltage $V_{ref}$ to the resistor R, thereby generating a reference current $i_{ref}$ as a function of the reference voltage $V_{ref}$, i.e.:

$$i_{ref}=V_{ref}/R \qquad (2)$$

In various embodiments, the reference current source 1 comprises also a current mirror 106 comprising an input transistor 108 and a plurality of output transistors 110a, 110b and 110c for generating the reference currents $i_{osca}$, $i_{osca}$ and $i_{oscc}$ for the various inverter stages IS' of the ring-oscillator 2' by mirroring/reproducing the current $i_{ref}$.

For example, when using an n-channel FET as variable current source 104, the input transistor 108 of the current mirror 106 is connected (e.g., directly) in series with the transistor 104 (see FIG. 3). Conversely, when using a p-channel FET as current source 104, the input transistor 108 of the current mirror 106 may be connected (e.g., directly) in series with the transistor 104 this transistor 104 or the input transistor 108 may correspond directly to the transistor 104 (see also FIG. 4).

Figure 5:
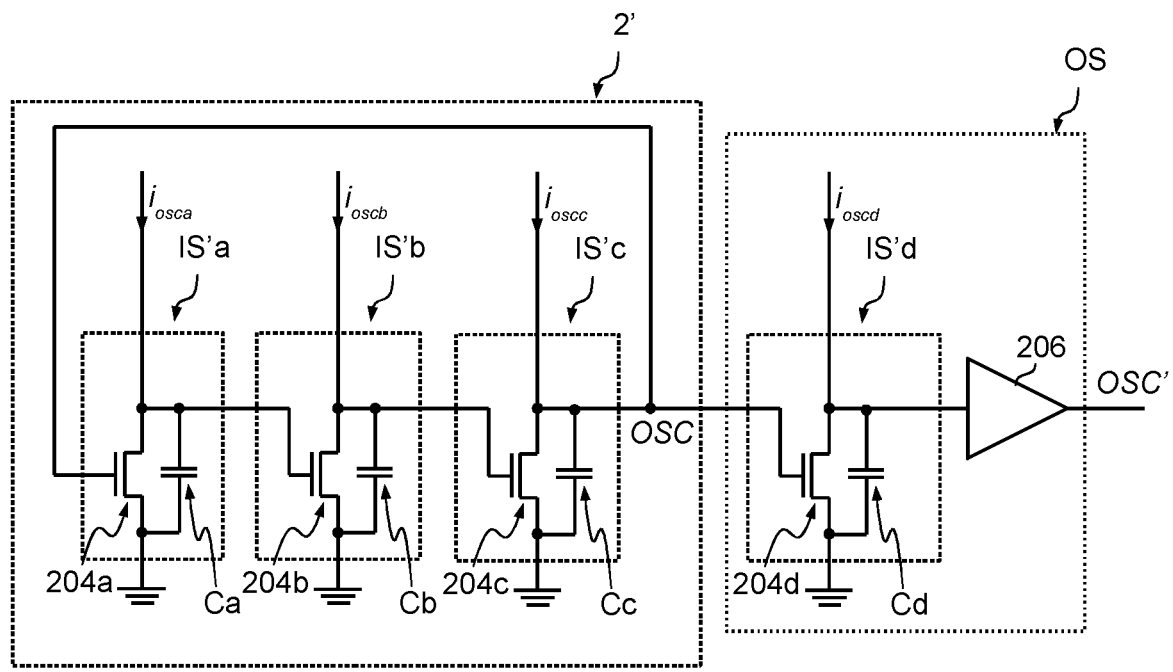
FIG. 5 shows an embodiment of a ring oscillator in accordance with the present disclosure.

FIG. 5 shows an embodiment of the ring-oscillator 2'. Specifically, in the embodiment considered, the ring oscillator 2' comprises again a plurality of inverter stages IS'. Specifically, the number of the inverter stages IS' is again odd and at least three, for example, 3, 5 or 7 inverter stages IS'. Thus, also the ring oscillator 2' comprises a first inverter stage IS'a, a last inverter stages IS'c, and one or more intermediate inverter stages IS'b. Each of the inverter stage IS' comprises an input terminal and an output terminal. Moreover, the inverter stages IS' are connected in cascade, wherein the:

the input terminal of each intermediate inverter stage IS'b is connected (e.g., directly) to the output terminal of the previous/upstream inverter stage IS' and the output terminal of each intermediate inverter stage IS'b is connected (e.g., directly) to the input terminal of the following/downstream inverter stage IS; and the input terminal of the first inverter stage IS'a is connected (e.g., directly) to the output terminal of the last inverter stage IS'c.

In the embodiment considered, the output terminal of the last inverter stage IS'c provides an oscillating signal OSC.

In various embodiments, each inverter stage IS' comprises only an n-channel FET 204, such as an NMOS. Accordingly, in the embodiment considered, the ring-oscillator 2' comprises n-channel transistors 204a, 204b and 204c for the inverter stages IS'a, IS'b and IS'c.

Specifically, in the embodiment considered, the gate terminals of the n-channel transistor 204 are connected (e.g., directly) to the input terminal of the respective inverter stage IS. The drain terminals of the n-channel transistors 204 are configured to receive a respective reference current $i_{osc}$, and the source terminals of the n-channel transistors 204 are connected (e.g., directly) to a reference voltage, such as ground. The drain terminals of n-channel transistors 204 are connected (e.g., directly) to the output terminal of the respective inverter stage IS'. In the embodiment considered, each of the inverter stages does thus not comprise p-channel FETs and the reference currents $i_{osca}$, $i_{oscb}$ and $i_{oscc}$ are applied (e.g., directly) to the drain terminals of the n-channel transistors 204a, 204b and 205c of the inverter stages IS'. For example, the drain terminal of the each of the n-channel transistors 204 may be connected directly to the drain terminal of a respective p-channel transistor 110 of the current mirror 106.

Generally, also in this case, a capacitance C is associated with each output terminal of an inverter stage IS' (which is also connected the input terminal of a following inverter stage IS'), i.e., a capacitance C is connected between the drain and source terminals of each of the transistors 204, which are also connected to the gate and source terminals of the transistors 204 of the following inverter stage IS'. Generally, the capacitance C may thus correspond to the sum of the parasitic gate-source and drain-source capacitances of the transistors 204 and/or an additional capacitor.

In various embodiments, the oscillator circuit may also comprise an output stage OS. Specifically, in the embodiment considered, the output stage OS comprises an input terminal connected to the output terminal of the last inverter stage IS'c of the ring-oscillator 2', thereby receiving the oscillating signal OSC, and an output terminal providing a stabilized oscillating signal OSC'.

For example, such an optional output stage OS may comprise:

an additional inverter stage IS'd, e.g., comprising an n-channel FET 204d, wherein the gate terminal of transistor 204d is connected (e.g., directly) to the output terminal of the last inverter stage IS'c, wherein the source terminal of the transistor 204a is connected (e.g., directly) to the reference voltage, e.g., ground, and the drain terminal receives a further reference current $i_{oscd}$ generated by the reference current source 1, e.g., by adding an additional output transistor 110d to the current mirror 106; preferably the capacitance Cd connected between the drain and source terminals of this transistor 204d is small with respect to the capacitances C of the inverter stages IS; and/or a comparator 206, such as a Schmitt-trigger.

Thus, when the transistor 204 of a given first inverter stage IS' is closed based on the voltage applied to the input terminal of the inverter stage IS' (which is provided by the output terminal of a previous inverter stage IS'), the capacitance C associated with the output terminal of the first inverter stage IS' is short circuited and the current $i_{osc}$ provided to the first inverter stage IS' will flow through the respective transistor 204.

Accordingly, the transistor 204 of the following second inverter stage IS' will be opened. In this condition, the current $i_{osc}$ provided to the second inverter stage IS' will thus charge the capacitance C associated with the output terminal of the second inverter stage IS'.

Once, the voltage $V_C$ at the capacitance C associated with the output terminal of the second inverter stage IS' reaches (or exceeds) the threshold voltage $V_{th1}$ of the transistor 204 of the following third inverter stage IS', i.e., $V_C \geq V_{th1}$, the respective transistor 204 will be closed.

This operation continues for the other inverter stages IS', and due to the odd number of inverter stages IS', the transistor 204 of each inverter stage IS' is alternatively switched on and off.

Thus, in the embodiment considered, the delay D introduced by each inverter stage IS' depends on the value of the capacitance C, the reference current $i_{osc}$ and the threshold voltage $V_{th1}$ of the n-channel FETs 204, and may be approximated with:

$$D=(C/i_{osc})\cdot V_{th1} \qquad (3)$$

Conversely, the frequency f of the oscillating signal OSC generated by the ring oscillator 2' may be calculated as a function of the delay D of all inverter stages IS' of the ring oscillator 2':

$$f = 1/(N \cdot D) \quad (4)$$

where N is the number of inverter stages IS' of the ring oscillator 2'.

Thus, also in this case, the oscillation frequency f depends directly on the currents $i_{osc}$ provided to the inverter stages IS' (i.e., currents $i_{osca}$, $i_{oscb}$ and $i_{oscc}$). However, in the embodiment considered, the oscillation frequency f depends also of the threshold voltages $V_{th1}$ of the n-channel transistors 204.

In the prior-art solutions, the inverter stages IS' are biased with currents $i_{osc}$ coming from a reference current source 1 configured to provide currents $i_{osc}$ as stable as possible over spread and temperature, insofar as the temperature dependencies of transistors 200 and 202 partially compensates each other.

Conversely, according to various embodiments of the present disclosure, the currents $i_{osc}$ generated by the reference current source 1' are not constant over temperate, but vary in order to compensate (or at least reduce the impact of) the variation of the threshold voltage $V_{th1}$ of the transistors 204 of the inverter stages IS', thereby maintaining the frequency f substantially constant over temperature, e.g., for typical operating temperatures between 0 and 40° C., possibly also between –20 and 80° C., preferably between –30 and 120° C. In this context the term substantially constant indicates that the frequency f varies less than 0.5% for the indicated temperature range.

Specifically, in the embodiments discussed in the forgoing, the reference current source 1 generates currents $i_{osc}$ by mirroring the current $i_{ref}$, which is proportional to the reference voltage $V_{ref}$. In various embodiments, the reference voltage $V_{ref}$ is generated by a band-gap reference 100. Specifically, in various embodiments, the band-gap reference comprising for this purpose a reference FET 112, such as an n-channel FET, e.g., an NMOS, wherein:

$$V_{ref} = V_{th2} \quad (5)$$

where the voltage $V_{th2}$ corresponds to the (gate-source) threshold voltage of the reference FET 112 of the band-gap reference 100.

Accordingly, by combining equations (2) and (5), equation (3) may be reformulated:

$$D = [C/(V_{th2}/R)] \cdot V_{th1} \quad (6)$$

Accordingly, by using within the band-gap reference 100 a reference FET 112 having the same temperature behavior as the transistor 204, the delay D will be independent from the variations of $V_{th1}$ and $V_{th2}$ over temperature. For example, preferably the reference FET 112 of the band-gap reference 100 is implemented with the same technology and in the same integrated circuit as the transistor 204. Preferably, both transistors 112 and 204 have also the same dimensions. Accordingly, preferably:

$$V_{th2}(T) = V_{th1}(T) \quad (7)$$

i.e., the threshold voltage $V_{th2}$ corresponds to the threshold voltage $V_{th1}$ also in case of variations of the temperature T.

In this case, equation (6) may be simplified to:

$$D = C \cdot R \quad (8)$$

In various embodiments, the spread of the delay D due to process/technology tolerances/spread may thus be substantially independent from the parameters of the transistors.

Generally, the delay D may still be affected by difference between the thresholds $V_{th1}$ and $V_{th2}$, but the spread of the values $V_{th1}$ and $V_{th2}$ should be constant when using transistors with the same dimensions and technology, and by implementing the transistors in a common integrated circuit.

Accordingly, the spread of the delay D may depend only on the spread of the capacitances C and the resistance of the resistor R. Similarly, the delay D may still depend on variations of the capacitances C and in particular the resistance of the resistor R over temperature.

In various embodiments, the reference FET 112 of the band-gap reference 100 may thus also be designed/dimensioned, such that the variation of the voltage $V_{th2}(T)$ over temperature does not compensate only the variation of the threshold $V_{th1}(T)$ but also the variation of the resistance R(T). Alternatively, the resistor R may be replaced with a plurality of resistors, which are connected in series and/or in parallel. Specifically, these resistors are selected in order to ensure that the overall resistance R of the resistors remains substantially constant over temperature. For example, for this purpose one or more of the resistors may be positive and/or negative coefficient resistors.

Figure 6:
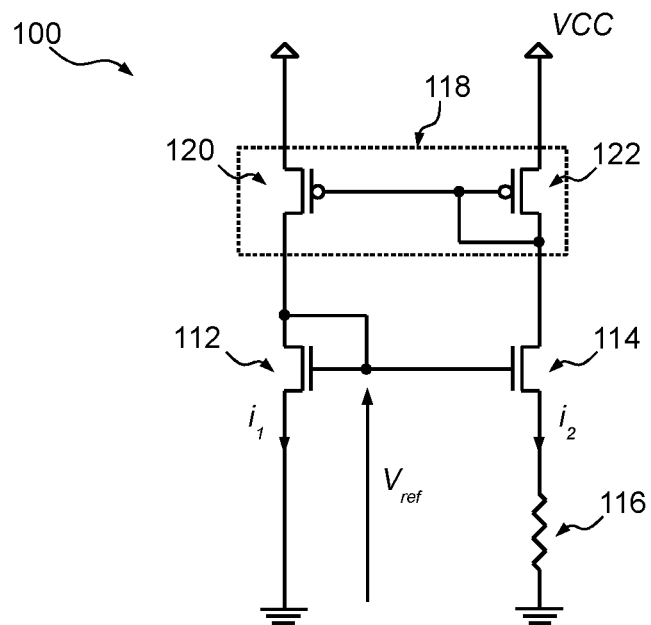
FIGS. 6 and 7 show embodiments of a band-gap reference adapted to be used in a reference current source.

FIG. 6 shows a first embodiment of a band-gap reference voltage source 100 in accordance with the present disclosure.

Specifically, in the embodiment considered, the band-gap reference voltage source 100 comprises a first branch comprising the reference transistor 112, in particular an n-channel FET, such as an NMOS, and p-channel FET 120, such as a PMOS, connected (e.g., directly) in series between the supply voltage VCC and a reference voltage, such as ground. For example, in the embodiment considered, the source terminal of the transistor 112 is connected (e.g., directly) to ground, the drain terminal of the transistor 112 is connected (e.g., directly) to the drain terminal of the transistor 120 and the source terminal of the transistor 120 is connected (e.g., directly) to the supply voltage VCC.

Moreover, in the embodiment considered, the band-gap reference voltage source 100 comprises a second branch comprising a further n-channel FET 114, such as an NMOS, a further p-channel FET 122, such as a PMOS, and a resistor 116 connected (e.g., directly) in series between the supply voltage VCC and the reference voltage, such as ground. For example, in the embodiment considered, the source terminal of the transistor 114 is connected (e.g., directly) via the resistor 116 to ground, the drain terminal of the transistor 114 is connected (e.g., directly) to the drain terminal of the transistor 122 and the source terminal of the transistor 122 is connected (e.g., directly) to the supply voltage VCC.

Specifically, in the embodiment considered, the n-channel transistors 112 and 114 are configured as a first current mirror and the p-channel transistors 120 and 122 are configured as a second current mirror 118. For this purpose, the gate terminal of the transistor 114 is connected (e.g., directly) to the gate terminal of the transistor 112, which is also connected (e.g., directly) to the drain terminal of the transistor 112. Similarly, the gate terminal of the transistor 120 is connected (e.g., directly) to the gate terminal of the transistor 122, which is also connected (e.g., directly) to the drain terminal of the transistor 122.

Accordingly, in the embodiment considered, a first current $i_1$ will flow through the first branch and a second current $i_2$ will flow through the second branch, wherein the currents $i_1$ and $i_2$ are substantially equal (determined as a function of the resistance of the resistor 116), thereby generating also the bias current for the transistor 112. Accordingly, the transistor 112 is biased and the voltage between the gate and source terminals of the transistor 112 will correspond to the reference voltage $V_{th2}$ of the transistor 112. Accordingly, the gate terminal of the transistor 112 may provide the reference voltage $V_{ref}$.

Figure 7:
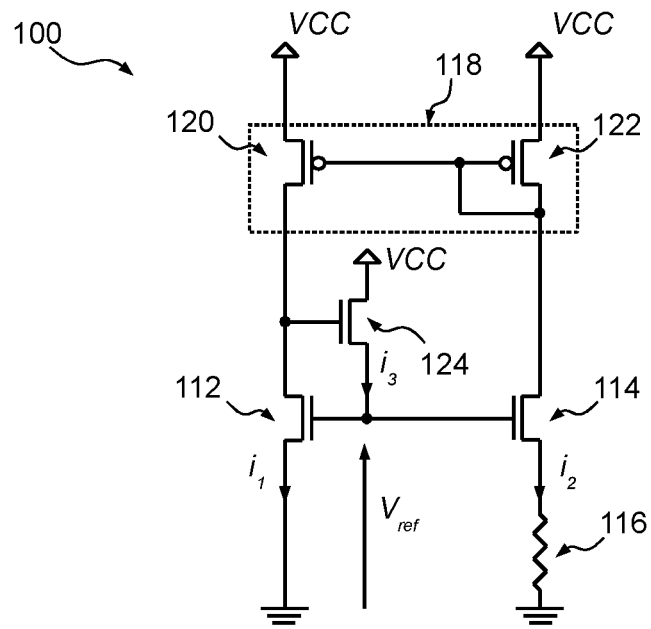

FIG. 7 shows a second embodiment of the band-gap reference voltage source 100.

Specifically, in the embodiment considered, the gate terminal of the transistor 112 is not connected anymore directly to the drain terminal of the transistor 112, but an additional transistor 124, such as an n-channel FET, e.g., an NMOS, is connected between these terminals. Specifically, in the embodiment considered, the source terminal of the transistor 123 is connected (e.g., directly) to the gate terminal of the transistor 112, the gate terminal of the transistor 124 is connected (e.g., directly) to the drain terminal of the transistor 112 and the drain terminal of the transistor 124 is connected (e.g., directly) to the supply voltage VCC. Essentially, the transistor 124 implements a buffered feedback for the current mirror 112/114. Specifically, the transistor 124 acts as a variable current source generating a current $i_3$ in order to maintain the voltage at the gate terminal of the transistor at the threshold voltage $V_{th2}$ of the transistor 112.

Figure 8:
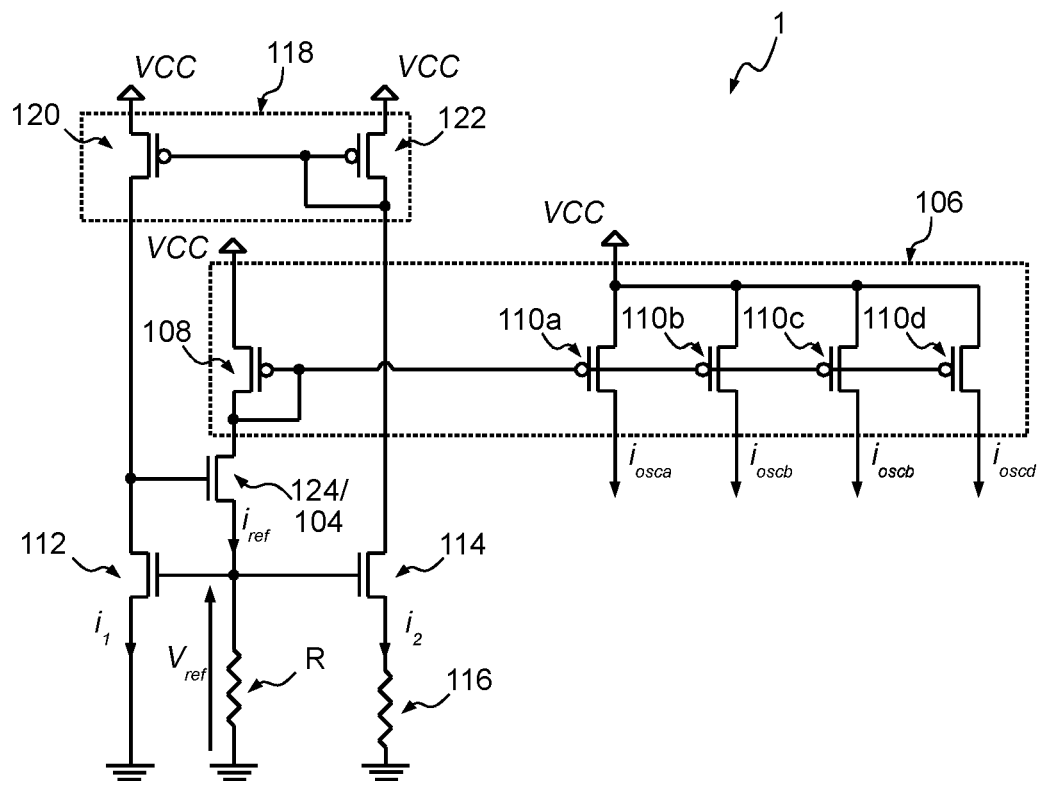
FIG. 8 shows a first embodiment of reference current sources for a ring oscillator.

FIG. 8 shows a first embodiment of the reference current source 1 using the band-gap reference source 100 of FIG. 7.

As mentioned before, the reference current source 1 comprises in addition to the band-gap reference source 100:
an operational amplifier 100;
a variable current source 104;
a resistor R; and
an optional current mirror 106.

In the embodiment of the band-gap reference source 100 shown in FIG. 7, the gate terminal of the transistor 112 already provides the voltage $V_{ref}$ corresponding to the threshold voltage $V_{th2}$ of the transistor 112. Moreover, the buffered feedback via the transistor 118 ensures that the voltage at the gate terminal of the transistor 112 is maintained at the threshold voltage $V_{th2}$, independently of the load condition at the gate terminal of the transistor 112.

Thus, the circuit already implements the function of the operational amplifier 102 and the variable current source 104. Specifically, the transistor 124 corresponds to the variable current source 104.

Accordingly, in the embodiment considered, the resistor R may be connected directly between the gate and source terminals of the transistor 112.

In the embodiment considered, the current flowing through the transistor 124/104 represents thus the reference current $i_3=i_{ref}$. Accordingly, the current mirror 106 may reproduce/mirror this current. For example, in the embodiment considered, again a current mirror 106 with p-channel FETs, e.g., PMOS, is used, wherein the input transistor 108 is connected between the supply voltage VCC and the drain terminal of the transistor 104. Specifically, the source terminal of the transistor 108 is connected (e.g., directly) to the supply voltage VCC and the drain terminal of the transistor 108 is connected (e.g., directly) to the drain terminal of the transistor 124/104. Finally, the gate terminal of the transistor 108 is connected (e.g., directly) to the drain terminal of the transistor 108 and the gate terminals of the output transistors 110a, 110b and 110c of the current mirror 106. In the embodiment considered, a further output transistor 110d is shown, which may be used to provide the reference current $i_{oscd}$ to the transistor 204d of the output stage OS.

Accordingly, in the embodiment discussed with respect to FIGS. 7 and 8, the current mirror 118 (comprising the transistors 120 and 122) is used to generate a bias current $i_t$ which is applied to the drain terminal of the reference transistor 112. Specifically, in the embodiment considered, the bias current $i_t$ is generated by mirroring the current $i_2$. Moreover, the transistor 124 (104) acting as a variable current source generates a separate current $i_3$ ($i_{ref}$) which is applied to a resistor R connected between the gate and source terminals of the reference transistor 112. Specifically, the transistor 124 is configured to regulate the current $i_3$ ($i_{ref}$) such that the voltage between the gate and source terminal (i.e., the voltage at the resistor) corresponds to the threshold voltage $V_{th2}$ of the reference transistor 112.

In general, the bias current $i_t$ for the reference transistor 112 may thus be generated also differently.

Figure 9:
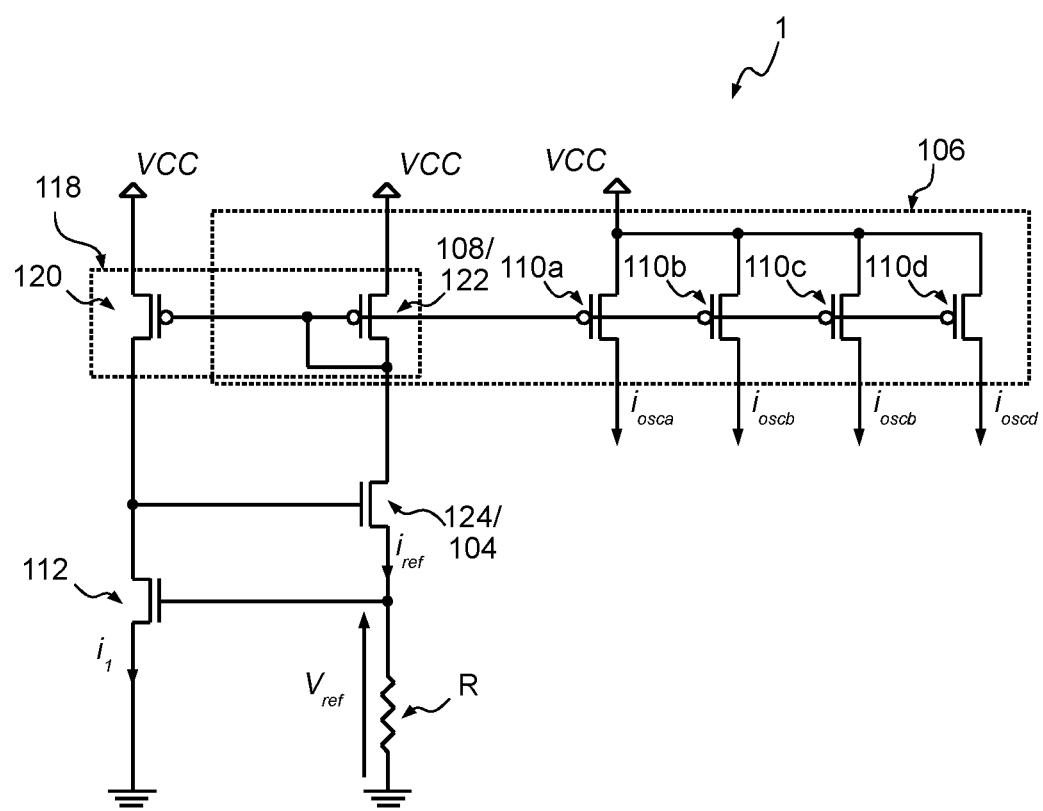
FIG. 9 shows a second embodiment of reference current sources for a ring oscillator.

For example, FIG. 9 shows an embodiment, wherein the current mirror 118 generates the bias current $i_1$ by mirroring directly the current $i_3$ ($i_{ref}$) provided by the transistor 124 (i.e., the variable current source 104). For example, in this case, the input transistor 108 of the current mirror 106 may also be used as input transistor 122 of the current mirror 118, thereby implementing a common current mirror. Moreover, in this case the second branch comprising the transistor 114 and the resistor 116 may be omitted. Accordingly, in the embodiment considered, the gate terminal of the input transistor 108 of the current mirror 106 (which corresponds to the input transistor 122 of the current mirror 118) is thus connected not only to the gate terminals of the output transistors 110 of the current mirror 106, but also the output transistor of the current mirror 118.

Accordingly, in the embodiments considered, the reference current source 1 comprises:
an n-channel reference transistor 112, wherein the source terminal of the reference transistor 112 is connected to a reference voltage, e.g., ground;
bias device configured to generate a bias current $i_1$, wherein the bias current is applied to the drain terminal of the reference transistor 112;
a resistor R connected between the gate and source terminals of the reference transistor 112;
an n-channel transistor 124, wherein the gate terminal of the transistor 124 is connected to the drain terminal of the transistor 112 and the source terminal is connected to the gate terminal of the transistor 112; specifically, the transistor 124 acts as a variable current source generating a reference current $i_{ref}$, which flows through the resistor R, thereby regulating the voltage at the resistor R to the threshold voltage $V_{th2}$ of the reference transistor 112; and
a current mirror 106 connected to the drain terminal of the transistor 124 and configured to generate a plurality of currents $i_{osc}$ by mirroring the reference current $i_{ref}$, wherein each currents $i_{osc}$ is applied to the drain terminal of a respective n-channel transistor 204 of the ring-oscillator 2'.

In the embodiment shown in FIG. 8, the bias current $i_1$ is generated by means of a current mirror 118, which is configured to mirror an additional current $i_3$ generated by a further transistor 114 and a further resistor 116. Conversely, in the embodiment shown in FIG. 9, the bias current $i_1$ is generated by means of a current mirror 118/106, which is configured to mirror the reference current $i_{ref}$.

Of course, without prejudice to the principle of the disclosure, the details of construction and the embodiments may vary widely with respect to what has been described and illustrated herein purely by way of example, without thereby departing from the scope of the present disclosure described herein.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An oscillator circuit, comprising:
   a ring oscillator including a plurality of inverter stages having an odd number, the plurality of inverter stages comprising a first inverter stage, a last inverter stage, and one or more intermediate inverter stages, wherein each inverter stage of the plurality of inverter stages includes:
      an input terminal;
      an output terminal;
      a first transistor having a drain coupled to the output terminal, a source coupled to a reference voltage, and a gate coupled to the input terminal, wherein the first transistor has a first reference threshold that varies; and
      a capacitance having a first side coupled to the drain of the first transistor and a second side coupled to the source of the first transistor, wherein the input terminal of an intermediate inverter stage of the one or more intermediate inverter stages is coupled to the output terminal of one of: the first inverter stage or another intermediate inverter stage of the one or more intermediate inverter stages that is an upstream inverter stage, wherein the output terminal of the intermediate inverter stage is coupled to the input terminal of one of: the last inverter stage or another intermediate inverter stage of the one or more intermediate inverter stages that is a downstream inverter stage, and wherein the input terminal of the first inverter stage is coupled to the output terminal of the last inverter stage; and
   a reference current source configured to generate a plurality of currents, wherein the plurality of currents are respectively provided to a plurality of drains of a respective plurality of first transistors of the plurality of inverter stages, the reference current source including:
      a resistance having a first terminal coupled to the reference voltage and having a second terminal;
      a reference transistor having a drain configured to receive a bias current, a source coupled to the reference voltage and a gate coupled to the second terminal of the resistance, wherein the reference transistor has a second reference threshold that varies over temperature;
      a bias device configured to generate the bias current, the bias device including a first current mirror configured to generate the bias current by mirroring a first current;
      a second transistor having a source coupled to the gate of the reference transistor and the second terminal of the resistance, a gate coupled to the drain of the reference transistor and a drain, the second transistor being configured to output a reference current and being operative to regulate a voltage of the resistance to the second reference threshold; and
      a second current mirror coupled to the drain of the second transistor and configured to generate the plurality of currents by mirroring the reference current.

2. The oscillator circuit according to claim 1, wherein the second current mirror includes:
   an input transistor having a drain and a gate coupled to each other and together coupled to the drain of the second transistor and a source coupled to a supply voltage, and
   a plurality of first output transistors respectively corresponding to the plurality of inverter stages and respectively outputting the plurality of currents, each first output transistor of the plurality of first output transistors having a drain coupled to the drain of the first transistor of a respective inverter stage, a source coupled to the supply voltage and a gate coupled to the gate of the input transistor.

3. The oscillator circuit according to claim 2, wherein the bias device includes:
   a second output transistor having a source coupled to the supply voltage, a gate coupled to the gate of the input transistor, and a drain coupled to the drain of the reference transistor.

4. The oscillator circuit according to claim 1, wherein the first current is generated by a third transistor and a second resistance.

5. The oscillator circuit according to claim 1, wherein the first transistor of each inverter stage and the reference transistor are manufactured using the same technology and have the same dimension, wherein the first and second reference thresholds vary similarly with temperature.

6. The oscillator circuit according to claim 1, wherein the drain of the first transistor of the last inverter stage provides an oscillating signal having a frequency (f) of:

$$f = 1/(N \cdot D)$$

wherein N is the number of inverter stages of the ring oscillator and D is a delay introduced by each inverter stage of the ring oscillator, and wherein:

$$D = [C/(V_{th2}/R)] \cdot V_{th1}$$

wherein C is the capacitance of each inverter stage, R is the resistance of the reference current source, and $V_{th1}$ and $V_{th1}$ are the first and said second reference thresholds, respectively.

7. The oscillator circuit according to claim 6, comprising:
   an output stage configured to stabilize the oscillating signal and including at least one of:
      a second inverter stage; or
      a comparator.

8. The oscillator circuit according to claim 1, wherein the first transistor, the second transistor and the reference transistor are n-channel field-effect transistors (FETs).

9. The oscillator circuit according to claim 1, wherein the reference voltage is ground voltage.

10. The oscillator circuit according to claim 3, wherein the input transistor, the plurality of first output transistors and the second output transistor are p-channel field-effect transistors (FETs).

11. An integrated circuit, comprising:
    a ring oscillator including a plurality of inverter stages, the plurality of inverter stages comprising a first inverter stage, a last inverter stage, and an intermediate inverter stage, wherein each inverter stage of the plurality of inverter stages includes:
       a first transistor having a first reference threshold that varies over temperature; and
       a capacitor coupled to the first transistor, the intermediate inverter stage being coupled between the first inverter stage and the last inverter stage, and an input terminal of the first inverter stage being coupled to an output terminal of the last inverter stage; and a reference current source coupled to the first transistors of the plurality of inverter stages, the reference current source including:
  a resistor having a first terminal and a second terminal;
  a reference transistor having a drain configured to receive a bias current, a source configured to receive a reference voltage and a gate coupled to the second terminal of the resistor, the reference transistor having a second reference threshold that varies over temperature;
  a bias device including a first current mirror configured to generate the bias current by mirroring a first current;
  a second transistor having a source coupled to the gate of the reference transistor, a gate coupled to the drain of the reference transistor and a drain, the second transistor being operative to regulate a voltage of the resistor to the second reference threshold; and
  a second current mirror coupled to the drain of the second transistor and configured to generate a plurality of currents for the plurality of inverter stages, respectively, by mirroring a reference current.

12. The integrated circuit according to claim 11, wherein the second current mirror includes:
  an input transistor having a drain and a gate coupled to each other and together coupled to the second transistor, and a source coupled to a supply voltage, and
  a plurality of first output transistors respectively corresponding to the plurality of inverter stages and respectively outputting the plurality of currents, each first output transistor of the plurality of first output transistors having a drain coupled to a drain of the first transistor of a respective inverter stage, a source coupled to the supply voltage and a gate coupled to the gate of the input transistor.

13. The integrated circuit according to claim 12, wherein the bias device includes:
  a second output transistor having a source coupled to the supply voltage, a gate coupled to the gate of the input transistor, and a drain coupled to a drain of the reference transistor.

14. The integrated circuit according to claim 11, wherein a drain of the first transistor of the last inverter stage provides an oscillating signal having a frequency (f) of:

$$f=1/(N \cdot D)$$

wherein N is the number of inverter stages of the ring oscillator and D is a delay introduced by each inverter stage of the ring oscillator, and wherein:

$$D=[C/(V_{th2}/R)] \cdot V_{th1}$$

wherein C is a capacitance of the capacitor of each inverter stage, R is a resistance of the resistor, and $V_{th1}$ and $V_{th1}$ are the first and said second reference thresholds, respectively.

15. The integrated circuit according to claim 14, further comprising:
  an output stage configured to stabilize the oscillating signal and including at least one of:
    a second inverter stage; or
    a comparator.

16. The integrated circuit according to claim 11, wherein the plurality of inverter stages have an odd number.

17. The integrated circuit according to claim 11, wherein the first transistor of each inverter stage has a drain coupled to an output terminal of the inverter stage, a source coupled to the reference voltage, and a gate coupled to an input terminal of the inverter stage, and wherein the capacitor has a first side coupled to the drain of the first transistor and a second side coupled to the source of the first transistor.

18. The integrated circuit according to claim 17, wherein the plurality of currents are respectively provided to the plurality of drains of the respective plurality of first transistors of the plurality of inverter stages.

19. The integrated circuit according to claim 18, wherein the second transistor is configured to output the reference current.

* * * * *